(12) United States Patent
Björk

(10) Patent No.: US 8,320,865 B2
(45) Date of Patent: Nov. 27, 2012

(54) WCDMA AGC RECEIVER SNR ADJUSTMENT AND SIGNALLING

(75) Inventor: Vimar Björk, Göteborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 60 days.

(21) Appl. No.: 12/991,479

(22) PCT Filed: May 15, 2008

(86) PCT No.: PCT/EP2008/055976
§ 371 (c)(1),
(2), (4) Date: Nov. 8, 2010

(87) PCT Pub. No.: WO2009/138125
PCT Pub. Date: Nov. 19, 2009

(65) Prior Publication Data
US 2011/0059711 A1    Mar. 10, 2011

(51) Int. Cl.
*H04B 1/06* (2006.01)
*H04K 3/00* (2006.01)
(52) U.S. Cl. .................................. 455/235.1; 455/241.1

(58) Field of Classification Search ............... 455/235.1, 455/240.1–241.1, 245.2, 247.1; 375/345
See application file for complete search history.

(56) References Cited

FOREIGN PATENT DOCUMENTS

| | | |
|---|---|---|
| CA | 2363400 A1 | 5/2002 |
| WO | WO 89/02198 A | 3/1989 |
| WO | WO 2004/071108 A | 8/2004 |
| WO | WO 2007/005498 A | 1/2007 |

*Primary Examiner* — Lee Nguyen

(57) ABSTRACT

The present invention relates to a method, an Automatic Gain Control control unit and a receiver for Noise change output signalling. It also relates to an Adjustment Unit, a receiver and a base band detector for adjustment of an Automatic Gain Control output signal on the basis of the Noise change output signalling. In a first step a receiver receives a communication input signal. In a second step at least one Automatic Gain Control attenuator or amplifier in the receiver attenuates the communication input signal. In a third step the receiver produces at least one AGC output signal. In a fourth step at least one AGC control unit in the receiver initiates a changed gain setting on the receiver, when the level of an AGC control unit input signal received by the unit has been below a first threshold level or above a second threshold level during a detection interval.

14 Claims, 8 Drawing Sheets

WCDMA AGC RECEIVER SNR ADJUSTMENT AND SIGNALLING

TECHNICAL FIELD

The present invention relates to a method, an Automatic Gain Control (AGC) control unit and a receiver for Noise change output signalling. It also relates to an Adjustment Unit (AU), a receiver and a base band detector for adjustment of an Automatic Gain Control (AGC) output signal on the basis of the Noise change output signalling. The AGC control unit, the receiver and the adjustment unit may be used in a Base Transceiver Station.

BACKGROUND

In a high performance multi carrier receiver the linearity and dynamic range requirements are very challenging. To meet the demanding requirements automatic gain control (AGC) can be used to adjust the dynamic range of the receiver according to the received signal level and thus relax the dynamic range of the receiver circuitry. In such a receiver an AGC control function is needed.

FIG. 1 shows a prior art AGC receiver 100 with an analogue input signal ($s_{in}$). The example of FIG. 1 shows a single carrier receiver for a telecommunication application and the input signal is an RF (Radio Frequency) signal. The input signal is modulated by the well know modulation technique called IQ-modulation. As this technique is well known to the skilled person it is not further explained here.

The communication input signal ($s_{in}$) is amplified in a first amplifier 101 and then passed through a first band pass filter 102 limiting the frequency to the RF range and producing as an output a first mixer input signal ($s_1$). This first mixer input signal is fed to a first mixer 103 outputting a first mixer output signal ($s_2$) at an intermediate frequency, which signal is passed through a second band pass filter 104. The filter produces as an output a first attenuator input signal ($s_3$) which is fed to a gain control unit 105 where the signal is first attenuated in a first attenuator 106. The attenuator can be replaced by an amplifier which attenuates the signal. The signal is then amplified in a second amplifier 107 and finally passed through a second mixer 108 to bring down the frequency of a gain control output signal ($s_4$) of the gain control unit to a low frequency.

The gain control output signal ($s_4$) is fed to a third band pass filter 109, the output of which is an analogue output signal ($s_5$) limited to the low frequency and fed to an Analogue Digital Converter (ADC), 110. The first amplifier 101, the first band pass filter 102, the first mixer 103, the second band pass filter 104, the gain control unit 105 and the third band pass filter 109 are all parts of an analogue unit 119.

The output of the ADC is a digital input signal ($s_6$) which is divided in two paths, an AGC input signal ($s_{61}$) fed to an Automatic Gain Control (AGC) unit, 112, and an AGC compensation unit input signal ($s_{62}$) fed to an AGC compensation unit 113. The AGC generates a first control signal $c_1$ to the attenuator 106 and a second control signal ($c_2$) to the AGC compensation unit.

The AGC compensation unit input signal ($s_{62}$) is fed to the AGC compensation unit 113 which introduces an increase or decrease of a gain to the AGC compensation unit input signal ($s_{62}$) based on the information in the second control signal ($c_2$). The AGC compensation unit output signal ($s_7$) is divided in two paths, a first path ($s_{71}$) and a second path ($s_{72}$), the first path being connected to a first mixer stage 114 and the second path being connected to second mixer stage 115.

A first mixer stage output signal ($s_{81}$) from the first mixer stage is fed to a first channel filter (RRC), 116, and a second mixer stage output signal ($s_{82}$) from the second mixer stage is fed to a second channel filter (RRC), 117.

RRC stands for Root Raised Cosine and defines the type of filter used. The RRC filters and the digital mixer stages are part of a well known IQ-demodulator producing the In-phase part (I) of the modulating signal from the first RRC filter and the Quadrature part (Q) from the second RRC filter.

IQ modulation is used to conserve bandwidth for a given data rate. This is accomplished by modulating two orthogonal data streams onto a common carrier. If the phases and amplitudes of both data stream (in-phase "I" and quadrature "Q"), then one of the sidebands is completely cancelled out. If there is no DC bias feed-through, then the carrier itself is completely cancelled out.

There are two mixer stages and two RRC filters for each carrier wave. In this example there was only one carrier wave and thus two mixer stages and two RRC filters. For a three carrier wave signal six mixer stages and six RRC filters are required. A common AGC compensation unit is feeding all mixer stages. The components; AGC compensation unit, AGC control unit, mixer stages and RRC filters are all parts of a digital unit 118 of the receiver.

The AGC unit 212 according to prior art is shown in FIG. 2. The AGC unit consists of a high, 201, and a low, 202, threshold detector which controls the AGC level up or down. The AGC level unit, 203, controls the analogue attenuation in the receiver and the AGC compensation in the digital unit. The AGC input signal ($s_{61}$) is a path of the digital input signal ($s_6$) from the ADC. The AGC input signal is divided in two paths, one fed to the high threshold detector and one to the low threshold detector. When the high threshold is detected the high threshold detector sends a third control signal ($c_3$) to the AGC level unit and when a low threshold is detected the low threshold detector sends a fourth control signal ($c_4$) to the AGC level unit.

The AGC level unit produces the two control signals ($c_1$) and ($c_2$). When the high threshold is detected the first control signal $c_1$ informs the first attenuator 106 to increase attenuation and the second control signal $c_2$ informs the AGC compensation unit to increase gain in the digital part to compensate for the attenuation in the analogue part. This means that the attenuation in the analogue part "AGC attenuation" is compensated with the same amount of gain increase in the digital part "AGC compensation" and the level of the first attenuator input signal ($s_3$) will be equal to the level of the AGC compensation unit output signal ($s_7$). When the low threshold is detected the first control signal ($c_1$) informs the first attenuator 106 to decrease attenuation and the second control signal ($c_2$) informs the AGC compensation unit to decrease gain to compensate for the decreased attenuation in the analogue part.

In prior art WCDMA receivers, the down-converted and RRC pulse shaped signal is normally level adjusted to a constant average level by a DAGC (Digital Automatic Gain Control) 120. The IQ-demodulator produces the In-phase part (I) of the modulating signal from the first RRC filter 116 and the Quadrature part (Q) from the second RRC filter 117. In the DAGC the received signal (I and Q) is multiplied 124 by the inverse of the averaged RMS (Root Means Square) level (X) to create a constant average level. The average level (X) is calculated in the calculator 121 on the basis of the modulated signals part (I and Q).

In particular, the modulated signal part (I) is mixed in a third mixer stage 122 with the inverse of the averaged RMS level, and a third mixer stage output signal ($S_{91}$) is fed to the base band. In particular, the modulated signal part (Q) is also mixed in a fourth mixer stage 123 with the inverse of the averaged RMS level, and a fourth mixer stage output signal ($S_{92}$) is fed to the base band.

Since a constant average level is enabled, the dynamic range of the received signal is now reduced to minimize the number of bits transmitted to the base band. These bits in combination with the RMS average ($S_{93}$) are sent to the base band. The RMS average value is sent more seldom than the received signal to minimize the signaling bandwidth. By doing this level adjustment on each individual receiver chain, signals from several diversity branches (from different receivers) can easily be combined in the base band by a RAKE receiver (type of receiver). A rake receiver is a radio receiver designed to counter the effects of multipath fading. It does this by using several "sub-receivers" called fingers, that is, several correlators each assigned to a different multipath component.

In the analog part 119 of the receiver 100 an AGC solution is often used to increase the dynamic range in the receiver, see FIG. 1. For over range interfering signals the gain in the receiver path is reduced to maintain the normal operational range of the ADC and other circuits after the attenuator 106. The gain is controlled by the attenuator 106 in the gain control unit 105 on the basis of the first control signal ($c_1$) generated by the AGC 212, see FIG. 2.

In ideal situation, only the desired signal 304 will come out from the AGC receiver 100, see FIG. 3. The problem however is that when the gain in the receiver chain is reduced (increased attenuation), the AGC noise 301 in the receiver 100 is increased from the normal noise level 303 due to the lower gain. The interfering signal 302 will be reduced 305 by the RRC filter 117,118 but the additional AGC noise in the desired signal bandwidth will be unchanged, see FIG. 3.

For time varying interfering signals 302 the AGC noise will vary over time due to the different states of the AGC in the receiver. Now, when the received signal is despreaded in time by the RAKE receiver, the SNR (Signal to Noise Ratio) is not optimal any more and the optimal reception performance is not obtained. SNR is closely related to the concept of dynamic, where dynamic range measures the ratio between noise and the greatest un-distorted signal on a channel. SNR measures the ratio between noise and an arbitrary signal on the channel.

The received signal with time varying noise is illustrated in FIG. 4. The AGC noise over the analogue part 119 will vary over time according to the AGC settings. The desired signal 404 and the normal noise level 403 is shown. As illustrated, the AGC noise 401 depends on the attenuation in the gain control unit 105. During a first time period (T1), with a gain level (G1), the AGC noise over the analogue part 119 is at one level (N1). During a second time period (T2), with a gain level (G2), the AGC noise is at another level (N2). The AGC compensation unit 113 introduces an increase or decrease of the gain (G1/G2) to the AGC compensation unit input signal ($s_{62}$) based on the information in the second control signal ($c_2$).

There is consequently a problem with the reception performance of an AGC receiver when. When the gain in the receiver chain is reduced the AGC noise in the receiver is increased due to the lower gain. The interfering signal will be reduced by the RRC filter but the additional AGC noise in the desired signal bandwidth will be unchanged, see FIG. 3. When the received signal is despreaded in time by the RAKE receiver, the SNR is not optimal any more and the optimal reception performance is not obtained, see FIG. 4.

SUMMARY

The object of the present invention is therefore to improve the reception performance of an AGC receiver in a pulsed interference environment.

The object is solved by means of a method for Noise change output signalling. In a first step a receiver receives a communication input signal ($s_{in}$). In a second step at least one Automatic Gain Control (AGC) attenuator or amplifier in the receiver attenuates the communication input signal ($s_{in}$). In a third step the receiver produces at least one AGC output signal ($s_9,s_{91},s_{92},s_{93}$). In a fourth step at least one AGC control unit in the receiver initiates a changed gain setting on the receiver. This is made when the level of an AGC control unit input signal received by the unit has been below a first threshold level or above a second threshold level during a detection interval. What particularly characterizes the method is that the AGC control unit further produces a Noise change output signal.

The object is also solved by means of an Automatic Gain Control (AGC) control unit for Noise change output signalling. The AGC control unit is adapted to initiate a changed gain setting on the receiver. This is made when the level of an AGC control unit input signal received by the unit has been below a first threshold level or above a second threshold level during a detection interval. What particularly characterizes the method is that the AGC control unit further produces a Noise change output signal. What particularly characterizes the AGC control unit is that it is further adapted to produce a Noise change output signal.

The object is also solved by means of an Adjustment Unit (AU) for adjustment of an Automatic Gain Control (AGC) output signal. According to an embodiment, the AU is adapted to receive the Noise change output signal sent by the AGC control unit. It is further adapted to adjust the AGC output signal ($s_9,s_{91},s_{92},s_{93}$) on the basis of the received Noise change output signal ($s_{11}$), so that an adjusted AGC output signal ($s_{10},s_{101},s_{102},s_{103}$) is produced.

The object is also solved by means of a receiver for Noise change output signalling. The receiver is adapted to receive the communication input signal. The receiver further comprising at least one Automatic Gain Control (AGC) attenuator or amplifier being adapted to attenuate the communication input signal ($s_{in}$). The receiver further is adapted to produce at least one AGC output signal. The receiver comprises at least one AGC control unit.

The object is finally solved by means of a base band detector for adjustment of an Automatic Gain Control (AGC) output signal. The detector comprises at least one AU.

Today most interfering signals like GSM terminals, HSUPA, TDD etc. are discontinuous pulsed signals and such signals will be more common due to the increased traffic in the network. The main advantage with the present invention is that the reception performance for AGC receivers in pulsed interference environments is significantly improved by signalling the Noise change for different time periods due to different AGC states.

Other preferred embodiments and advantages of the invention will emerge from the dependent claims and the detailed description below.

BRIEF DESCRIPTION OF THE DRAWINGS

The invention will now be described in greater detail below with reference to the embodiment shown in the accompanying drawings. These drawings are used for illustration only and do not in any way limit the scope of the invention.

DETAILED DESCRIPTION

Figure 1:
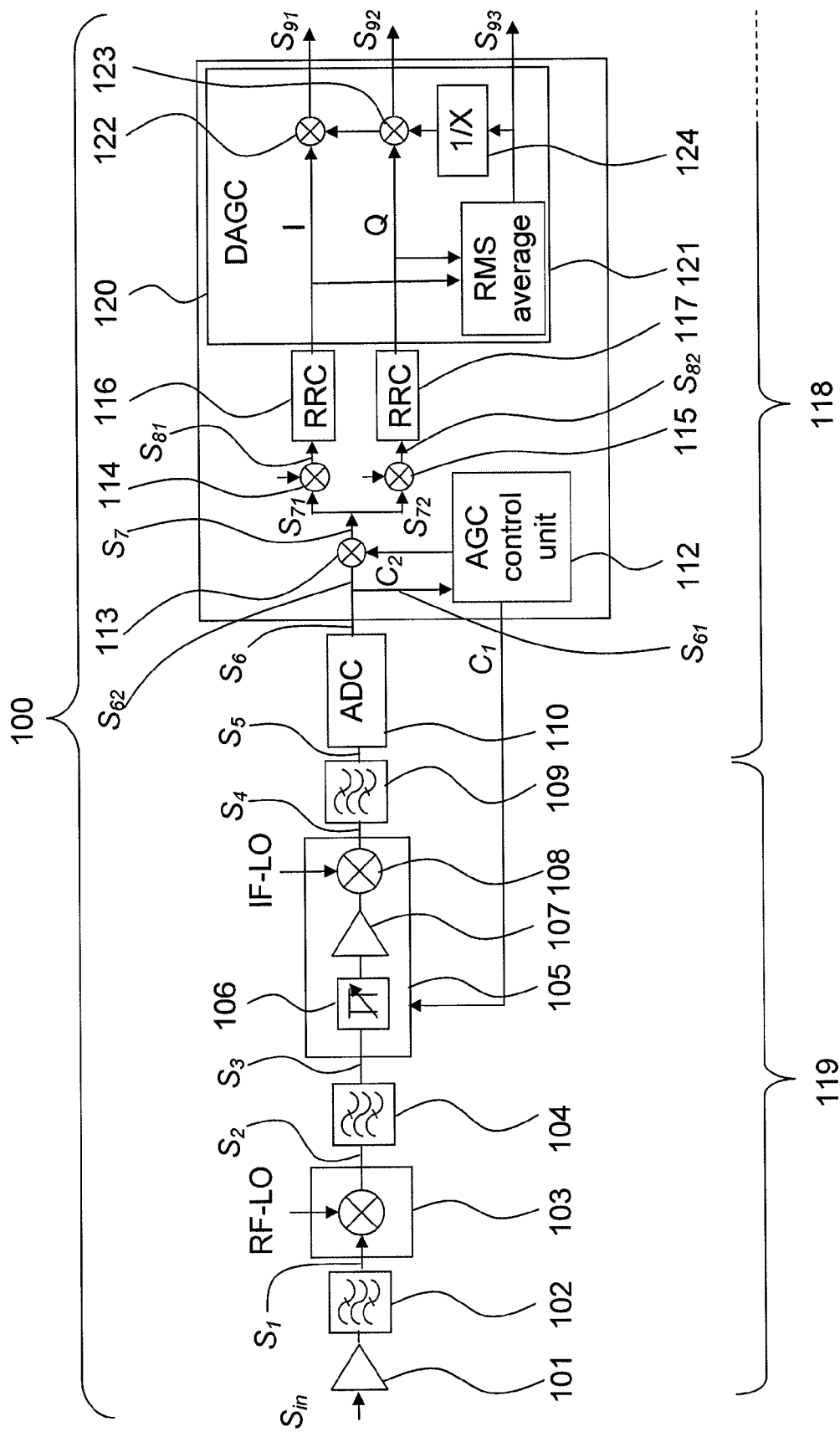
FIG. 1 shows a block diagram of a receiver using AGC according to prior art.

The invention will now be described in detail with reference to embodiments described in the detailed description and shown in the drawings. The embodiments of the invention with further developments described in the following are to be regarded only as examples and are in no way to limit the scope of the protection provided by the patent claims.

The present invention relates to a method, an Automatic Gain Control (AGC) control unit and a receiver for Noise change output signalling. It also relates to an Adjustment Unit (AU), a receiver and a base band detector for adjustment of an Automatic Gain Control (AGC) output signal on the basis of the Noise change output signalling. The AGC control unit, the receiver, the adjustment unit may be used in a Base Transceiver Station.

The (AGC) control unit, the receiver, the adjustment unit (AU) and the base band detector are adapted for performing the method steps described in the detailed description. It should therefore be understood by a person skilled in the art that since the method steps are described, the AGC control unit, the receiver, the adjustment unit (AU) and the base band detector are also described.

Figure 5:
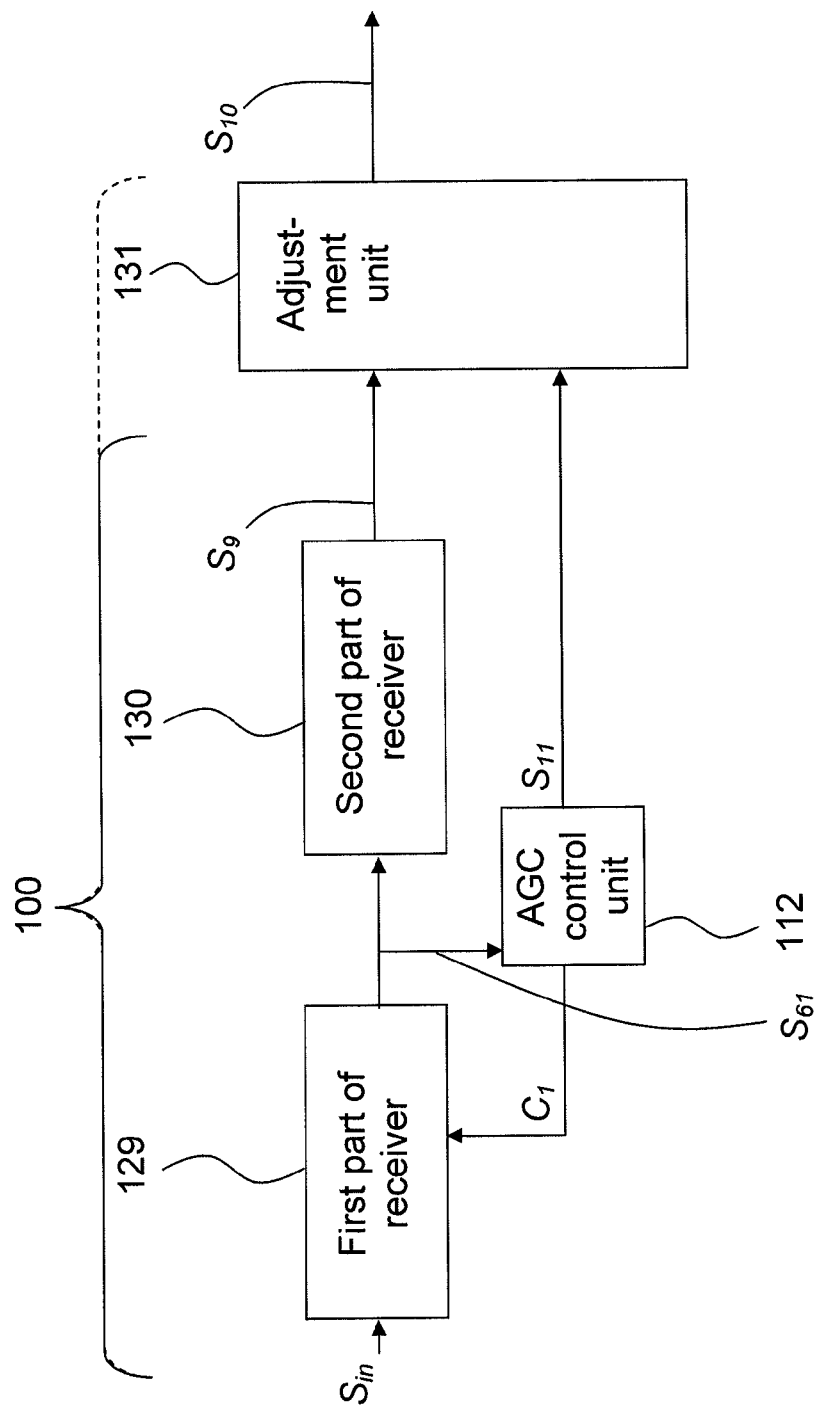
FIG. 5 shows a block diagram of a part of the AGC illustrating the broadest concept of the present invention.
Figure 8:
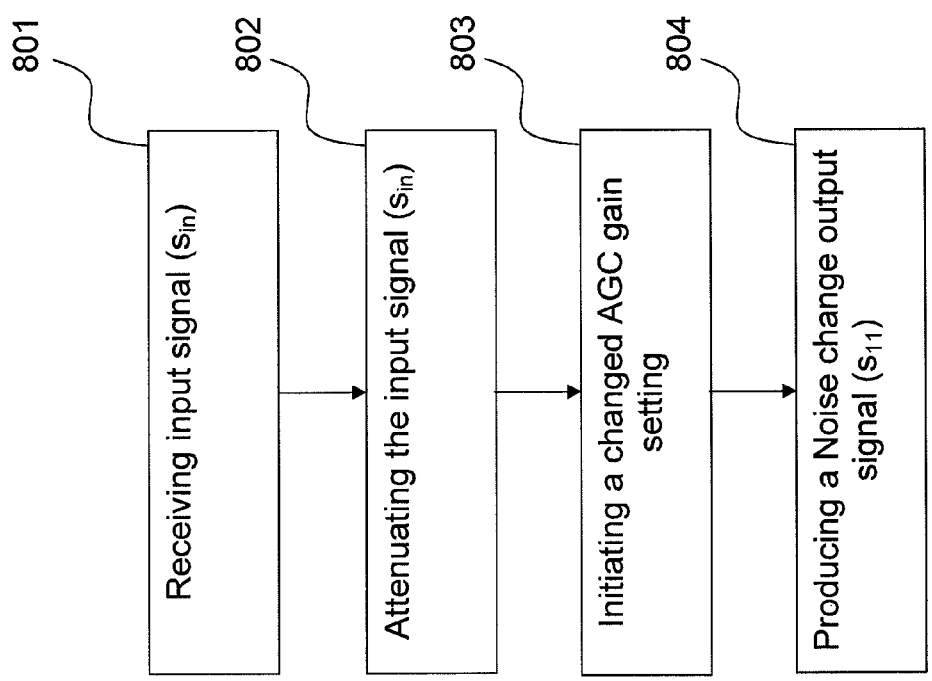
FIG. 8 shows a flow diagram of the method steps according to the present invention.

The present invention is illustrated in FIGS. 5 and 8. FIG. 5 shows a block diagram with a part of an AGC receiver according to FIG. 1, and reference will be made also to FIG. 1 to better explain the method. This receiver is an example of a receiver in which the AGC control can be performed. In the receiver 100 an AGC input signal ($s_6$) is divided into an AGC compensation unit input signal ($s_{62}$) and the AGC control unit input signal ($s_{61}$). The AGC control unit 112 initiates the changed gain setting based on the AGC control unit input signal ($s_{61}$). This is made through a first control signal ($c_1$) fed to the attenuator or amplifier 106 for changing the attenuation of an attenuator input signal (s3) and a second control signal ($c_2$) sent to the AGC compensation unit 113 for changing the gain of the AGC compensation input signal ($s_{62}$) so that a changed AGC compensation output signal ($s_7$) is produced.

The receiver 100 produces at least one AGC output signal ($s_9,s_{91},s_{92},s_{93}$) in a second part 130 of the receiver. As illustrated in FIG. 1, a the DAGC (Digital Automatic Gain Control) 120 produces such AGC output signals ($s_{91},s_{92},s_{93}$) on the basis of said AGC compensation output signal ($s_7$). The producing is performed by receiving the AGC compensation output signal ($s_7$), divide it into two paths ($s_{71},s_{72}$), and produce a mixed in-phase signal part ($s_{91}$) and a mixed signal quadrature part ($s_{92}$) with a substantially constant average level together with a Root Mean Square (RMS) signal ($s_{93}$), the signal parts and the RMS signal being the AGC output signals.

With reference to FIGS. 5 and 8 the invention will now be described. FIG. 5 shows a block diagram of a part of the AGC intended to illustrate the broadest concept of the present invention. An example of the first part 129 is illustrated in FIG. 1, with reference 119. FIG. 8 intends to illustrate the method steps for Automatic Gain Control according to the broadest scope of the present invention.

In a first step 801, see FIG. 8, the receiver 100 receives a communication input signal ($s_{in}$). The signal is received by a first part 129 of the receiver. In a second step 802 at least one Automatic Gain Control (AGC) attenuator or amplifier 106 in the first part 129 of the receiver 100 attenuates the communication input signal ($s_{in}$). The receiver produces at least one AGC output signal ($s_9,s_{91},s_{92},s_{93}$). In a third step 803, at least one AGC control unit 112 in the receiver 100 initiates a changed gain setting on the receiver. This is made when the level of the AGC control unit input signal ($s_{61}$) received by the unit 112 has been below a first threshold level or above a second threshold level during an entire detection interval.

Figure 2:
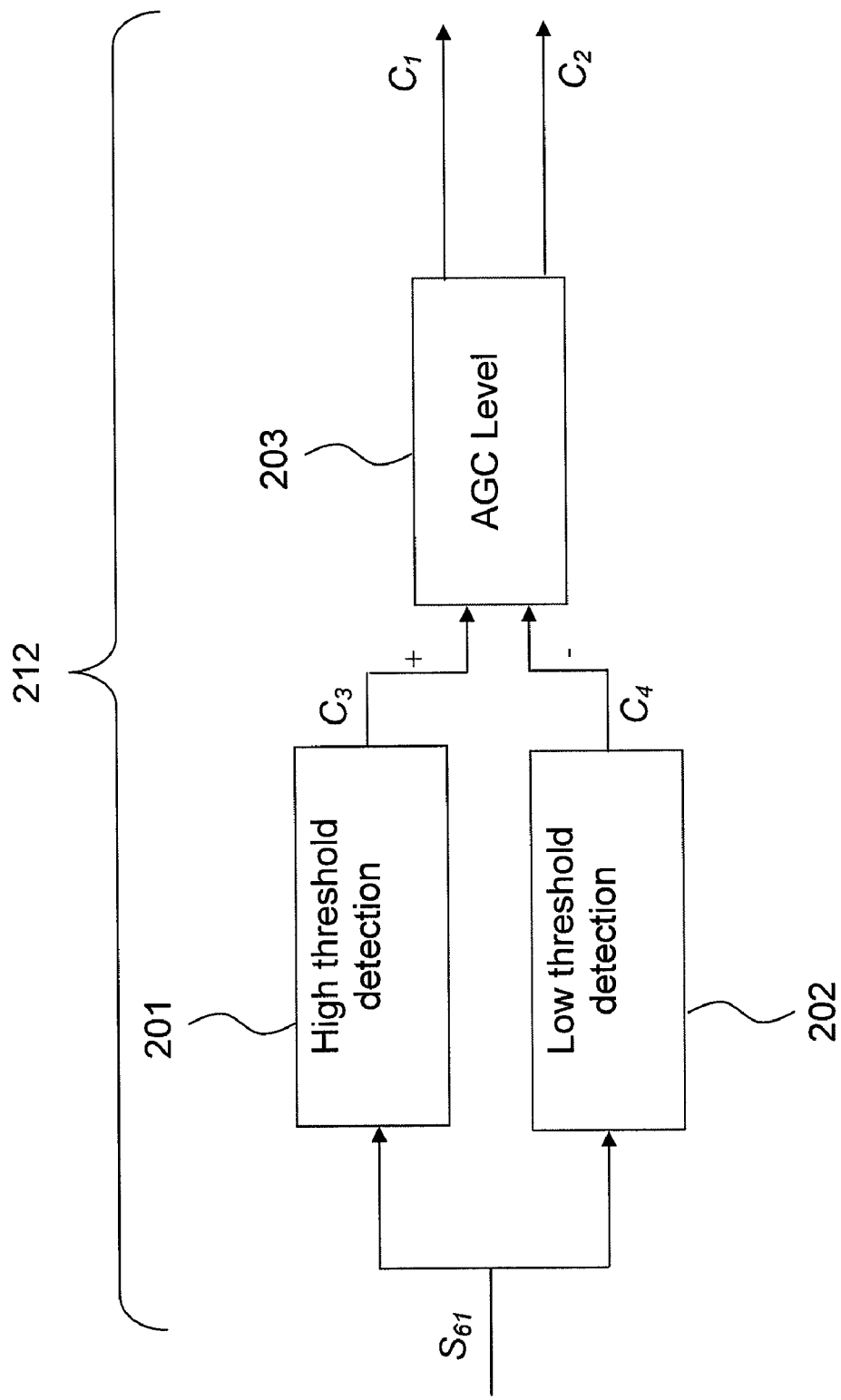
FIG. 2 shows a block diagram of a prior art Automatic Gain Control (AGC) unit.

An example of an AGC unit 212 detecting the threshold level is shown in FIG. 2. The AGC unit consists of a second (high), 201, and a first (low), 202, threshold detector which controls the AGC level up or down. The AGC input signal is divided into two paths, one fed to the high threshold detector 201 and one to the low threshold detector 202. When the high (second) threshold is detected the high threshold detector sends a third control signal ($c_3$) to the AGC level unit and when a low (first) threshold is detected the low threshold detector sends a fourth control signal ($c_4$) to the AGC level unit 203.

The first control signal $c_1$ informs the first attenuator 106 to increase attenuation and the second control signal $c_2$ informs the AGC compensation unit to increase gain in the digital part to compensate for the attenuation in the analogue part. When the control unit input signal ($s_{61}$) has been below the first (low) threshold level or above a second (high) threshold level during an entire detection interval a changed gain setting is initiated through the first and second control signals.

Figure 3:
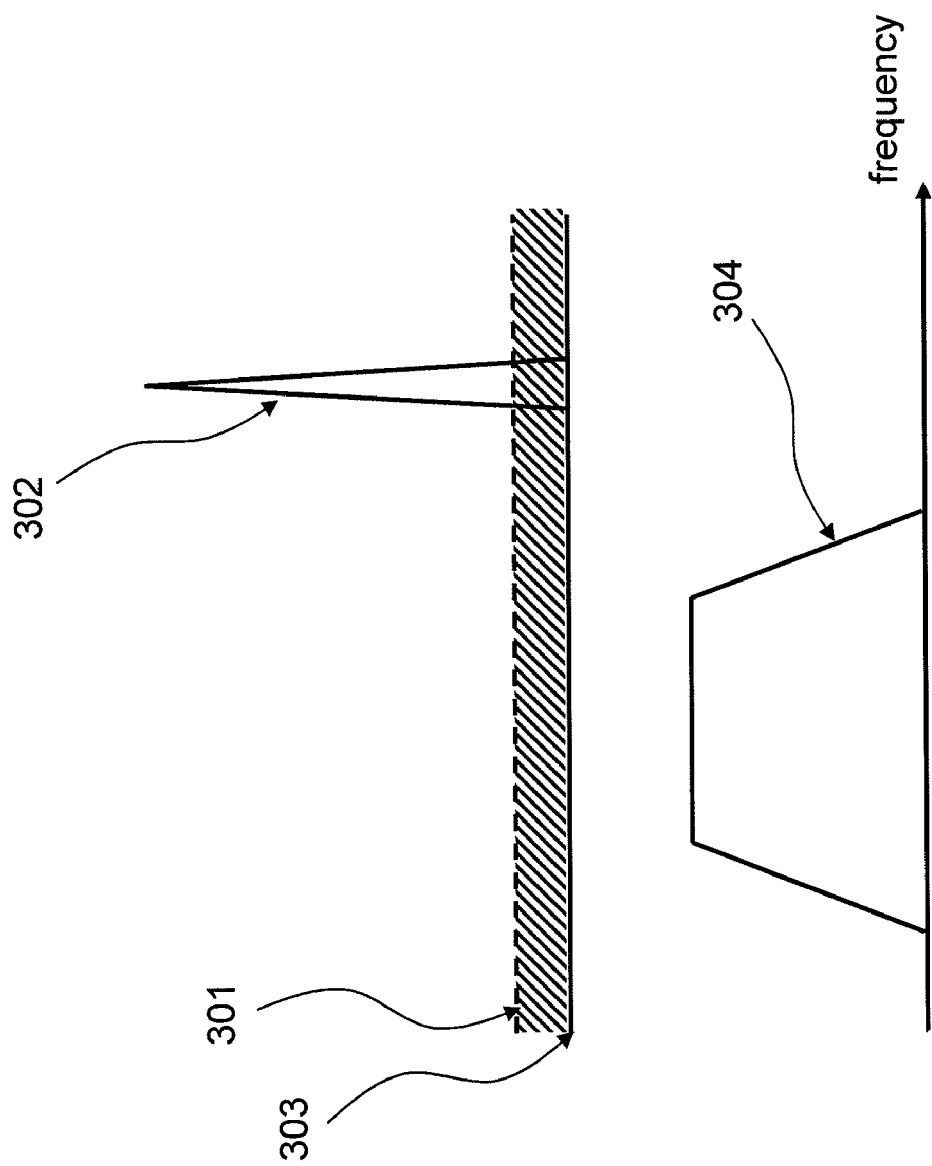
FIG. 3 shows the noise increase in the AGC receiver according to FIG. 1.

In ideal situation, only the desired signal 304, will come out from the AGC receiver 100, see FIG. 3. However, when the gain in the receiver chain is reduced (increased attenuation), the AGC noise 301 in the receiver 100 is increased from the normal noise level 303 due to the lower gain. The AGC noise is measured on the compensation unit output signal $s_7$, see FIG. 1. The interfering signal 302 will be reduced by the RRC filter 117,118 but the additional AGC noise in the desired signal bandwidth will be unchanged, see FIG. 2. Optimal reception performance can therefore not be obtained by the receiver.

Figure 4:
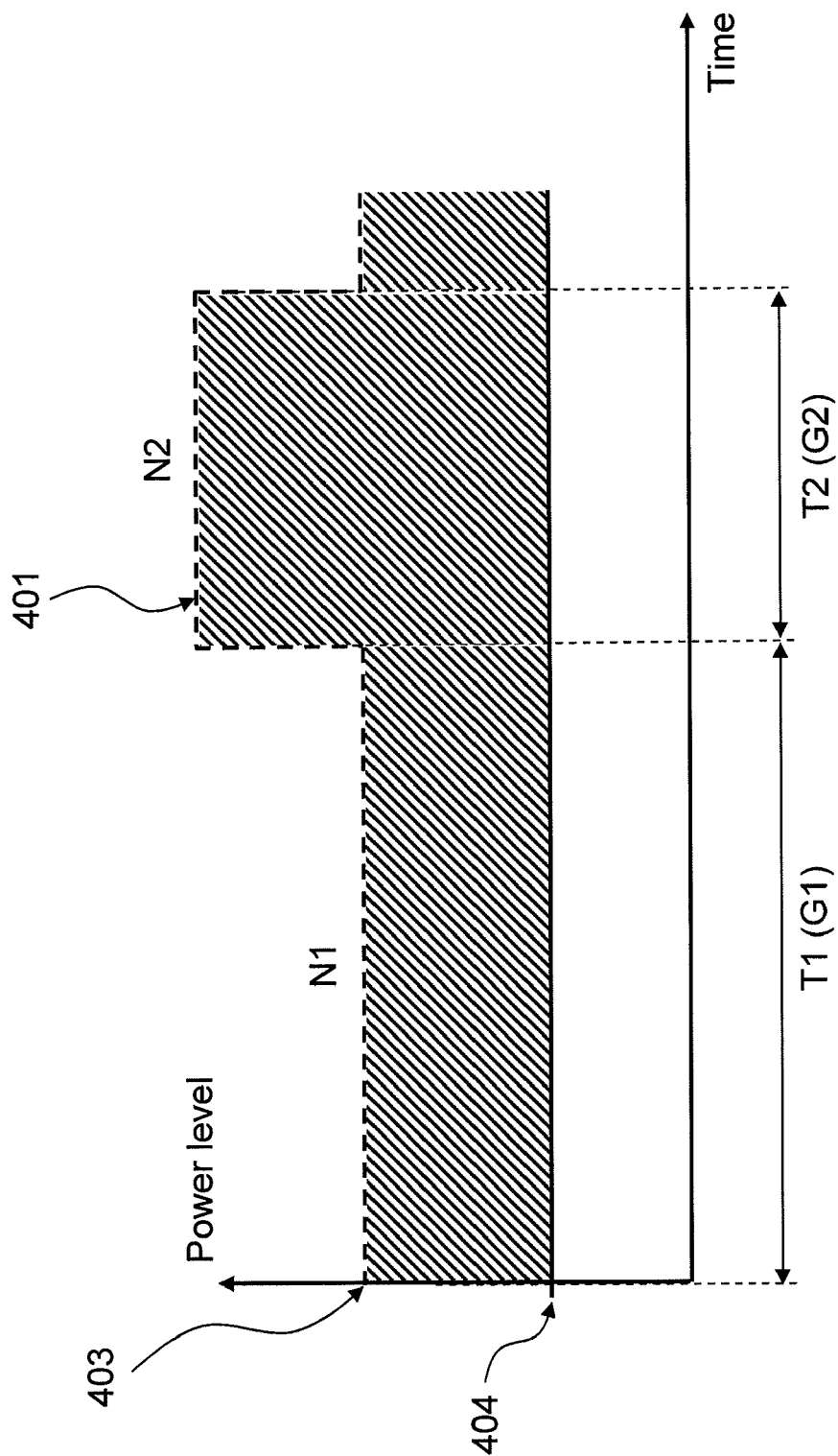
FIG. 4 shows the received signal with time varying noise in the digital part of the receiver according to FIG. 1.

Moreover, as illustrated in FIG. 4, the AGC noise 401 depends on the power level of the compensation unit output signal $s_7$. During a first time period (T1), with a gain level (G1), the AGC noise is at one level (N1). During a second time period (T2), with a gain level (G2), the AGC noise is at another level (N2). The AGC compensation unit 113 introduces an increase or decrease of the gain (G1/G2) to the AGC compensation unit input signal ($s_{62}$) based on the information in the second control signal $c_2$.

In order to solve these problems the AGC control unit 112 according to the present invention, see FIG. 5, in a fourth step 804, see FIG. 8, produces a Noise change output signal ($s_{11}$). This gives the advantage that the reception performance for AGC receivers in pulsed interference environments is significantly improved. The Noise change output signal ($s_{11}$) indicates the AGC control unit 112 state and the noise rise in the AGC control input signal (s6) caused by a changed attenuation of the communication input signal ($s_{in}$).

The AGC noise level will vary over time according to the AGC setting, as described in relation to FIG. 4. In FIG. 4 the receiver noise variation over time is shown with a constant desired signal level. The reason for the variation in noise level is that the gain level (G1/G2) is adjusted in over time by the AGC compensation unit 113, controlled by the AGC control unit 112, see FIGS. 1 and 2. The gain level is controlled on the basis of the AGC control unit input signal ($s_{61}$), see FIG. 2. The AGC control unit consequently knows the gain level and the variation over time.

Since the noise increase from the attenuation and the state of the AGC control unit 112 is known, the AGC output signal ($s_9,s_{91},s_{92},s_{93}$) can be adjusted to obtain optimal reception performance in dynamic interference scenarios. The AGC control unit knows the noise increase from the attenuation and the state of the AGC control unit and can therefore be used to provide this information. This is provided via the Noise change output signal ($s_{11}$).

The AGC output signal ($s_9,s_{91},s_{92},s_{93}$) is preferably adjusted on the basis of the Noise change output signal ($s_{11}$), so that an adjusted AGC output signal ($s_{10},s_{101},s_{102},s_{103}$) is produced. This is for instance performed by adjusting the signal gain of the AGC output signal ($s_9,s_{91},s_{92},s_{93}$). The signal gain is preferably adjusted to minus twice the noise rise in the AGC control input signal ($s_{61}$) caused by the changed attenuation of the attenuator input signal ($s_3$). This has been shown as a suitable adjustment to achieve an adjustment independent of the duty cycle of the receiver.

Figure 6:
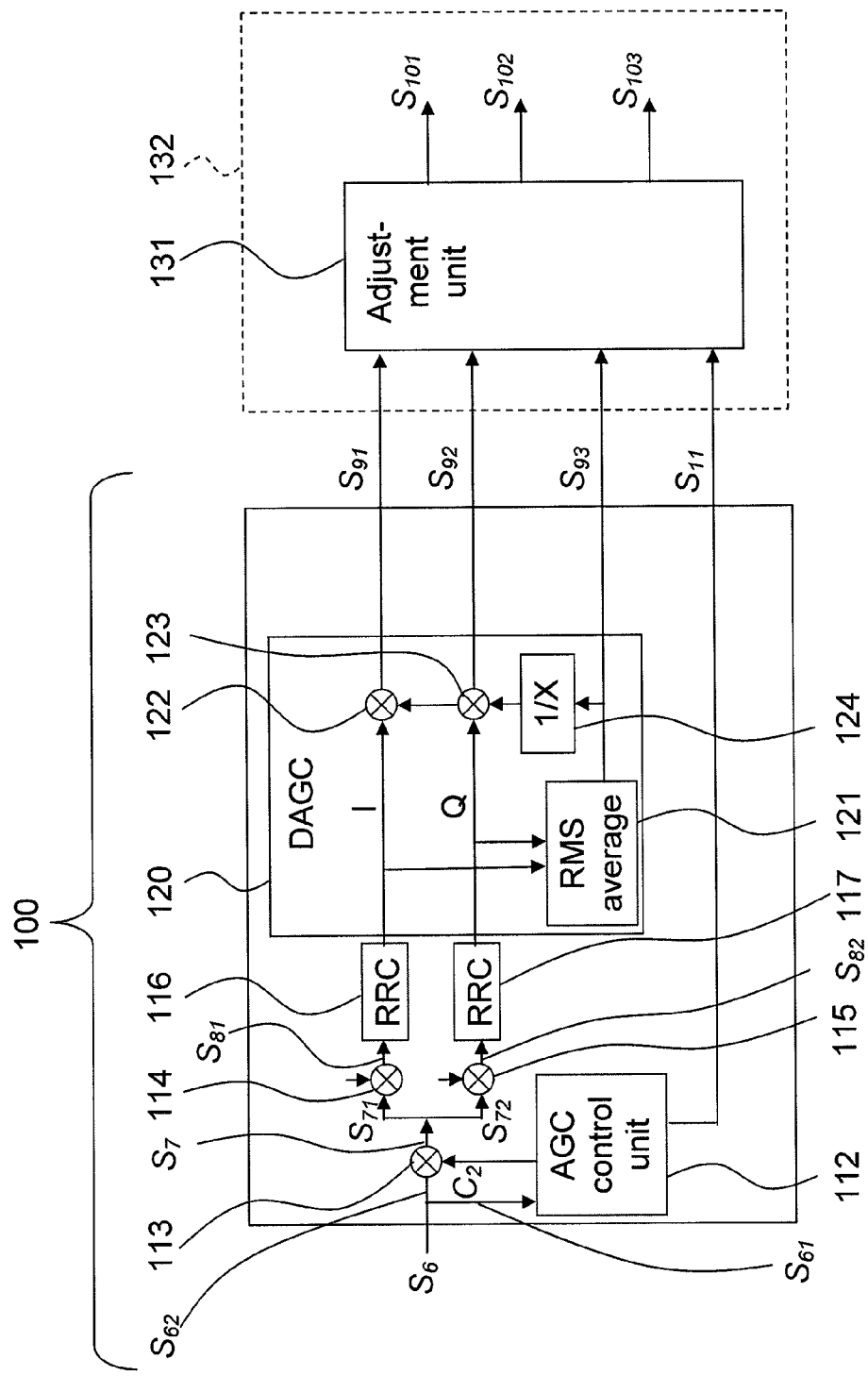
FIG. 6 shows a block diagram of a part of the AGC illustrating one embodiment of the present invention.
Figure 7:
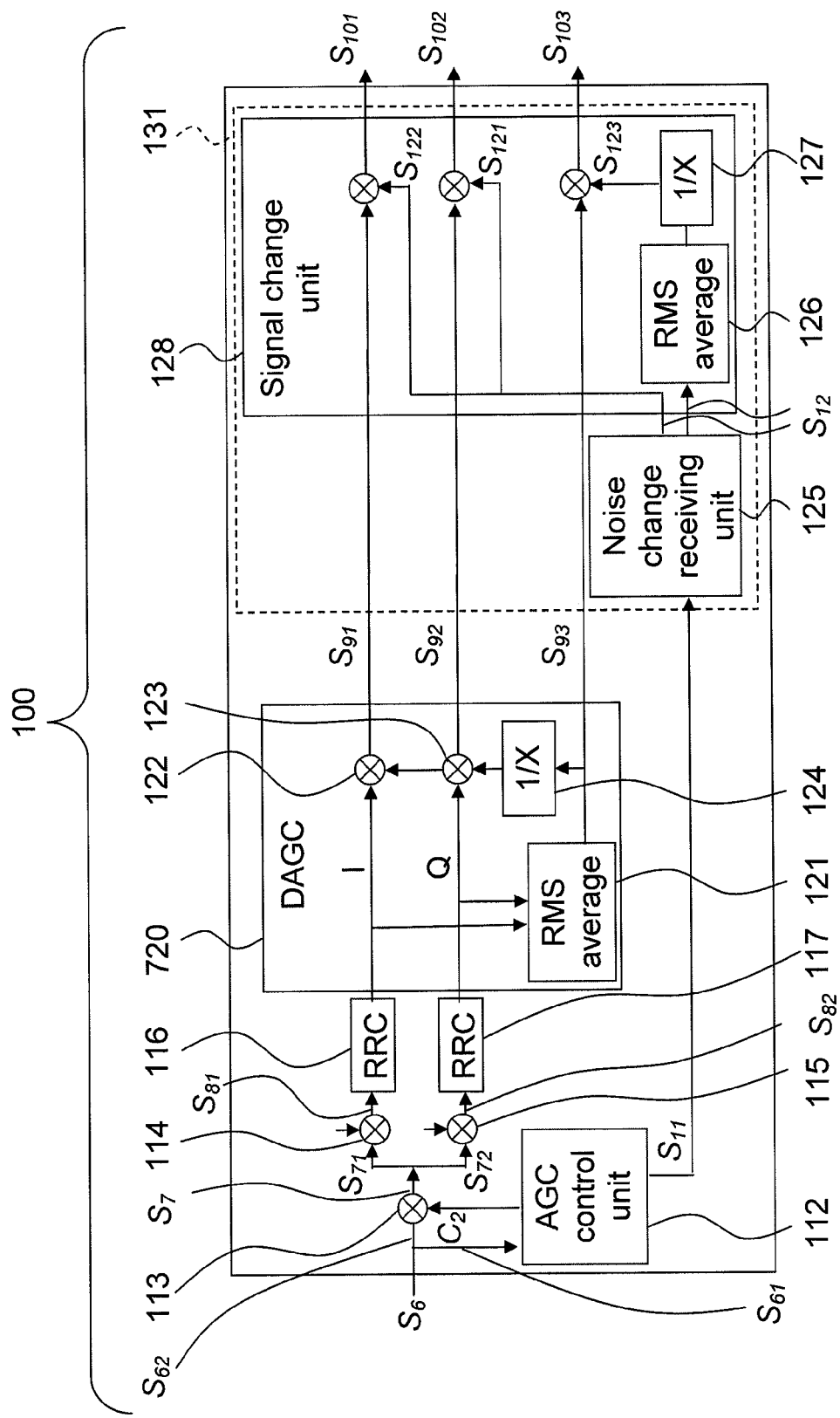
FIG. 7 shows a block diagram of a part of the AGC illustrating another embodiment of the present invention.

The Noise change output signal ($s_{11}$) is used to adjust the AGC output signal ($s_9,s_{91},s_{92},s_{93}$). FIG. 5-7 illustrates how this could be achieved. An Adjustment Unit (AU) 131 could be used, located in the receiver (FIG. 7) or located in a base band detector (FIG. 6) on the base band.

The AU 131 in all examples according to FIG. 5-7 adjusts the AGC output signal ($s_9,s_{91},s_{92},s_{93}$) on the basis of the Noise change output signal ($s_{11}$) so that an adjusted AGC output signal ($s_{10},s_{101},s_{102},s_{103}$) is produced. In FIG. 5 AU 131 is shown as a box.

Two embodiments will now be described in relation to the receiver 100 according to FIG. 1. This receiver (100) is a Wideband Code Domain Multiple Access (WCDMA) receiver. The WCDMA receiver parts will not be described again in relation to the embodiments of the present invention, since they were described in relation to FIG. 1.

In a first embodiment, the AGC output signals ($s_{91},s_{92},s_{93}$) are adjusted on the base band 132. This is illustrated in FIG. 6. The AGC control unit 112 sends the Noise change output signal ($s_{11}$) to the base band. This means that the AGC attenuation change is signalled on the base band. In the same way the receiver sends the AGC output signal ($s_{91},s_{92},s_{93}$) on the base band.

When an AU 131 is present, it is preferably located in a base band detector (not shown). It may be a new functionality or entity within the base band detector. When receiving the Noise change output signal ($s_{11}$), the AU can adjust the received AGC output signals ($s_{91},s_{92},s_{93}$) which are also sent on the base band. This example intends to illustrate that the invention can be used for any type of base band detector. The requirement is that the AU in the base band detector is adapted to handle the received Noise change output signal ($s_{11}$).

In a second embodiment, the AGC output signals ($s_{91},s_{92},s_{93}$) are adjusted by the receiver 100. This is illustrated in FIG. 7. The AGC control unit 112 sends the Noise change output signal ($s_{11}$) within the receiver. The AGC output signals ($s_{91},s_{92},s_{93}$) are also sent within the receiver. This means that the receiver sends the adjusted AGC output signal ($s_{101},s_{102},s_{103}$) to the base band. When the AU 131 is present, it is located in the receiver 100. When receiving the Noise change output signal ($s_{11}$), the AU adjusts the AGC output signal ($s_{91},s_{92},s_{93}$) in the receiver.

The AU 131 according to at least one of the embodiments may comprise a Noise change receiving unit 125 which sends at least one adjustment control signal ($s_{12},s_{121},s_{122},s_{123}$) to a signal change unit 128. The signal change unit then adjusts the AGC output signal ($s_9,s_{91},s_{92},s_{93}$) on the basis of the adjustment control signal so that an adjusted AGC output signal ($s_{10},s_{101},s_{102},s_{103}$) is produced.

FIG. 7 presents an example of how the gain is adjusted in a signal change unit 128 in the Adjustment Unit (AU) 131. The AGC output signals ($s_{91},s_{92},s_{93}$) are received by the Noise change receiving unit 125. It sends at least one adjustment control signal ($s_{12},s_{121},s_{122},s_{123}$). The mixed in-phase signal part ($s_{91}$) and a mixed signal quadrature part ($s_{92}$) is gain adjusted by the mixers on the basis of control signals ($s_{121},s_{122}$) sent by the Noise change receiving unit.

The RMS signal (s93) is multiplied 126,127 with the inverse of the RMS average of the gain adjustment on the basis of control signals ($s_{12}$) sent by the Noise change receiving unit. The reason for this is to maintain the correct power level for measurement functions in the base band. The averaging time should be the same as the RMS signal update interval. The RMS signal update interval needs to be fast compared to the average power variation of the received signal to get an accurate compensation of the RMS signal value.

The invention is not limited to the embodiments above, but may vary freely within the scope of the invention. For example, it should be realized by a person skilled in the art that the Adjustment Unit (AU) 131 according to FIG. 7 is only an example and that the scope of the invention include all Adjustment Unit that are able to adjust of an Automatic Gain Control (AGC) output signal ($s_9,s_{91},s_{92},s_{93}$) on the basis of the received Noise change output signal ($s_{11}$), so that an adjusted AGC output signal ($s_{10},s_{101},s_{102},s_{103}$) is produced.

Moreover. It should also be understood by a person skilled in the art that the invention can be used for any type of base band detector. The requirement is that the AU in the base band detector is adapted to handle the received Noise change output signal ($s_{11}$). The AU can also be positioned somewhere else within the base band, outside the detector.

Finally, it should furthermore be understood by a person skilled in the art that the WCDMA receivers are only examples of receivers and that the invention is not limited to such receivers.

The invention claimed is:

1. An Automatic Gain Control (AGC) control unit for Noise change output signalling, wherein the AGC control unit being adapted to initiate a changed gain setting on a receiver when the level of an AGC control unit input signal received by the unit has been below a first threshold level or above a second threshold level during a detection interval, where the receiver is arranged to produce at least one AGC output signal;

the AGC control unit being adapted to produce a Noise change output signal, where the at least one AGC output signal is adjusted on the basis of the noise change output signal, so that an adjusted AGC output signal is produced;

an Adjustment Unit (AU) for adjustment of the at least one AGC output signal, wherein the AU is adapted to receive the Noise change output signal sent by the AGC control unit, the AU is adapted to adjust the signal gain of the at least one AGC output signal on the basis of the received Noise change output signal, so that the adjusted AGC output signal is produced, wherein the AU is adapted to adjust the signal gain to minus twice the noise rise in the AGC control unit input signal, caused by the changed attenuation.

2. The AGC control unit according to claim 1 wherein the Noise change output signal indicates the AGC control unit state and the noise rise in the AGC control input signal caused by a changed attenuation of a communication input signal.

3. The AGC control unit according to claim 1 wherein the AGC control unit is adapted to send the Noise change output signal to the base band.

4. The AU according to claim 1 wherein the AU comprises a Noise change receiving unit which is adapted to send at least one adjustment control signal to a signal change unit, which signal change unit is adapted to adjust the AGC output signal on the basis of the received Noise adjustment control signal so that an adjusted AGC output signal is produced.

5. A receiver for Noise change output signalling, the receiver being adapted to receive a communication input signal,
   the receiver comprising at least one Automatic Gain Control (AGC) attenuator or amplifier being adapted to attenuate the communication input signal, and
   the receiver comprising at least one AGC control unit according to claim 1.

6. The receiver according to claim 5 for adjustment of an Automatic Gain Control output signal, wherein the receiver comprises at least one AU.

7. The receiver according to claim 6 wherein the receiver is adapted to send the adjusted AGC output signal to the base band.

8. The receiver according to claim 5 wherein the receiver is adapted to send the AGC output signal to the base band.

9. A base band detector for adjustment of an Automatic Gain Control (AGC) output signal, the detector comprising at least one AU according to claim 1.

10. A method for Noise change output signalling, comprising the steps of:
    a receiver receiving a communication input signal,
    at least one Automatic Gain Control (AGC) attenuator or amplifier in the receiver attenuating the communication input signal,
    the receiver producing at least one AGC output signal,
    at least one AGC control unit in the receiver initiating a changed gain setting on the receiver when the level of an AGC control unit input signal received by the unit has been below a first threshold level or above a second threshold level during a detection interval, and
    the AGC control unit producing a Noise change output signal, and
    adjusting the AGC output signal on the basis of the noise change output signal, so that an adjusted AGC output signal is produced, wherein
    the signal gain of the at least one AGC output signal is adjusted on the basis of the Noise change output signal, so that the adjusted AGC output signal is produced and
    the signal gain is adjusted to minus twice the noise rise in the AGC control unit input signal, caused by the changed attenuation.

11. The method according to claim 10 wherein the Noise change output signal indicates the AGC control unit state and the noise rise in the AGC control input signal caused by a changed attenuation of the communication input signal.

12. The method according to claim 10 wherein the receiver adjusts the AGC output signal.

13. The method according to claim 12 wherein an Adjustment Unit (AU) located in the receiver adjusts the AGC output signal on the basis of the received Noise change output signal so that an adjusted AGC output signal is produced.

14. The method according to claim 12 wherein the receiver sends the adjusted AGC output signal to the base band.

* * * * *

UNITED STATES PATENT AND TRADEMARK OFFICE
CERTIFICATE OF CORRECTION

PATENT NO. : 8,320,865 B2  
APPLICATION NO. : 12/991479  
DATED : November 27, 2012  
INVENTOR(S) : Bjork Page 1 of 1

It is certified that error appears in the above-identified patent and that said Letters Patent is hereby corrected as shown below:

On the Title Page, in Field (57), under "ABSTRACT", in Column 2, Line 2, delete "Control control" and insert -- Control (AGC) control --, therefor.

On the Title Page, in Field (57), under "ABSTRACT", in Column 2, Line 3, delete "unit," and insert -- unit (AU), --, therefor.

On the Title Page, in the Figure, delete Tag "720" and insert Tag -- 120 --, therefor.

In Fig. 1, Sheet 1 of 8, delete "FIG" and insert -- FIG. --, therefor at each occurrence throughout the drawings.

In Fig. 7, Sheet 7/8, delete Tag "720" and insert Tag -- 120 --, therefor.

In Column 1, Line 25, delete "($s_{in.}$)." and insert -- ($s_{in}$). --, therefor.

In Column 5, Line 52, delete "(s3)" and insert -- ($s_3$) --, therefor.

In Column 5, Line 58, delete "a the" and insert -- the --, therefor.

In Column 6, Line 66, delete "(s6)" and insert -- ($s_6$) --, therefor.

In Column 8, Line 19, delete "(s93)" and insert -- ($s_{93}$) --, therefor.

In Column 8, Line 38, delete "Moreover. It" and insert -- Moreover, it --, therefor.

Signed and Sealed this  
Twenty-sixth Day of March, 2013

Teresa Stanek Rea  
*Acting Director of the United States Patent and Trademark Office*